United States Patent
Tchamov et al.

[11] Patent Number: 5,990,718
[45] Date of Patent: Nov. 23, 1999

[54] MULTIVIBRATOR CIRCUIT

[76] Inventors: Nikolay Tchamov, Lindforsinkatu 21 A 17, FIN-33720, Tampere, Finland; Petri Jarske, Pirilänkuja 8, FIN-34240, Kämmenniemi, Finland

[21] Appl. No.: 08/973,778
[22] PCT Filed: May 7, 1997
[86] PCT No.: PCT/FI97/00275
  § 371 Date: May 18, 1998
  § 102(e) Date: May 18, 1998
[87] PCT Pub. No.: WO97/43829
  PCT Pub. Date: Nov. 20, 1997

[30] Foreign Application Priority Data

May 9, 1996 [FI] Finland .................................. 96198

[51] Int. Cl.⁶ .................................................. H03K 3/284
[52] U.S. Cl. ................................... 327/227; 331/113 R
[58] Field of Search ............................ 327/185, 227, 327/228; 331/113 R, 144

[56] References Cited

U.S. PATENT DOCUMENTS

| | | | |
|---|---|---|---|
| 4,007,426 | 2/1977 | Utsunomiya ..................... | 331/113 R |
| 4,025,877 | 5/1977 | Hara et al. ....................... | 331/113 R |
| 4,692,718 | 9/1987 | Roza et al. ....................... | 331/113 R |
| 4,695,744 | 9/1987 | Giordano ......................... | 327/333 |
| 4,717,892 | 1/1988 | Hitomi .............................. | 331/113 R |
| 4,884,042 | 11/1989 | Menon et al. ................... | 331/113 R |
| 4,910,472 | 3/1990 | Tanino .............................. | 331/113 R |
| 5,469,118 | 11/1995 | Lawton ............................ | 331/113 R |

FOREIGN PATENT DOCUMENTS

| | | |
|---|---|---|
| 0 361 529 | 4/1990 | European Pat. Off. . |
| 37 06319 A1 | 9/1988 | Germany . |
| 62-78908 | 4/1987 | Japan . |
| 1-291517 | 11/1989 | Japan . |

*Primary Examiner*—Tuan T. Lam
*Attorney, Agent, or Firm*—Scully, Scott, Murphy & Presser

[57] ABSTRACT

High speed multivibrator circuits operable with lower operating voltages are disclosed. A multivibrator circuit comprises an operating voltage source, first and second nonlinear amplifier components, each comprising a first and a second main electrode and a control electrode, wherein the first main electrode of the second amplifier component is connected to control the control electrode of the first amplifier component, and the first main electrode of the first amplifier component is connected to control the control electrode of the second amplifier component. A capacitor is connected between the second main electrode of the first and second amplifier components. First and second resistors connect the first main electrode of the first and second amplifier components to a first potential of the operating voltage source. A pull-down circuit is connected between the second main electrodes of the first and second amplifier components and a second potential of the operating voltage source. The pull-down circuit comprises third and fourth amplifier components, acting as active pull-down components which are cross-connected such that they are alternately in conducting and nonconducting states due to forced control by the states of the first and second amplifier components.

6 Claims, 4 Drawing Sheets

MULTIVIBRATOR CIRCUIT

FIELD OF THE INVENTION

The invention relates generally to multivibrators and specifically to so-called emitter-coupled multivibrators.

BACKGROUND OF THE INVENTION

Current- and voltage-controlled oscillators (ICO and VCO) are important components in the structures of transmitters and receivers. When applications to portable wireless communications systems are concerned, the main requirements for VCO/ICOs are: an operational frequency range of 1 to 20 GHz, a very low phase noise and the lowest possible operating voltage and power consumption. Depending on the structure, a communications device may comprise several VCO/ICOs needed for different purposes, e.g. frequency conversion, synthetization, modulation, etc. Their performance affects strongly the performance of the whole communications unit. On the other hand, the demand to implement these oscillators for silicon technologies faces several problems.

Oscillator circuits, i.e. oscillators, can be implemented by many different circuit structures. One of them is an astable (free-running) multivibrator. FIG. 1 shows a conventional emitter-coupled multivibrator circuit, which has been used for implementing voltage-controlled oscillators (VCO). The circuit comprises two transistors Q1 and Q2, between which is provided a positive feedback by cross-coupling each transistor base to the collector of the other transistor. The positive feedback and series resonance circuits Rc1-C and Rc2-C constituted by the resistors RC1 and RC2 and a capacitance C lead to that the output of the multivibrator oscillates continuously between two states, after the oscillation once has been trigged. The oscillation frequency is determined by the component values of the RC series resonance circuits. The oscillation frequency can be controlled by changing some of these component values, typically the capacitance C.

The speed of such a multivibrator circuit (maximum resonance frequency) depends primarily on the properties of the transistors Q1 and Q2. One known way of increasing the speed of the multivibrator circuit is to provide a positive feedback from the collector of one transistor to the base of the other transistor via a buffer transistor. This enables a higher base current, which in turn discharges parasitic capacitances of the base circuit of the transistor faster and accelerates thus the switching of the transistor from one state to another.

The lowest possible operating voltage Vcc is at least 1.1V, when it is assumed that current sources 3 and 4 are ideal, i.e. no voltage loss is provided in them. When the ideal current sources are replaced by some practical circuit structure, such as current mirrors constituted by MOS transistors M11 M21 and M31 in FIG. 2, Vcc increases. The current sources M11, M21 and M31 of FIG. 2 need a direct voltage of about 0.7 V across them, the total Vcc being at least about 1.8 V. The volume resistance of the MOS transistors is the main reason for a high drain source voltage Vds, when the transistors are on. Returning to the operating principle of the circuit, it can be stated that current paths are either Q1-C-M21 or Q2-C-M11 and that the current mirrors produce a stable current through the reference capacitor C, which is the main reason for the typical low phase noise. In search of a new way of increasing the speed, the reference capacitor cannot be decreased much more, because it will be of the order of the parasitic capacitances, which leads to the fact that a controlled planning of the circuit is not possible.

Nowadays there is, however, a need of ever-increasing speeds while an operating voltage as low as possible is desired, especially in electronic equipments using battery power supplies.

SUMMARY OF THE INVENTION

An object of the present invention is a novel multivibrator circuit having a higher speed th an the circuits according to the prior art.

Another object of the present invention is a novel multivibrator circuit having a lower operating voltage than the circuits according to the prior art.

The invention relates to a multivibrator circuit, comprising an operating voltage source, a first non-linear amplifier component comprising a first and a second main electrode and a control electrode, a second non-linear amplifier component comprising a first and a second main electrode and a control electrode, the first main electrode of the second amplifier component being connected to control the control electrode of the first amplifier component, and respectively, the first main electrode of the first amplifier component being connected to control the control electrode of the second amplifier component, a capacitive component connected between the second main electrode of the first amplifier component and the second main electrode of the second amplifier component, a first and a second resistor, via which the first main electrode of the first amplifier component and the first main electrode of the second amplifier component, respectively, are connected to a first potential of the operating voltage source. The oscillator is characterized in that it additionally comprises a pull-down circuit between the second main electrodes of the first and the second amplifier component and a second potential of the operating voltage source.

The invention also relates to a multivibrator circuit, which is characterized in that it comprises a third amplifier component connected in series between the second main electrode of the first amplifier component and the second potential of the operating voltage source, a fourth amplifier component connected in series between the second main electrode of the second amplifier component and the second potential of the operating voltage source, a fifth amplifier component, in which the first main electrode is connected to the first potential of the operating voltage source, the second main electrode is operationally connected to the second potential of the operating voltage source via a resistor or a current source and the control electrode is connected to the second main electrode or the control electrode of the first amplifier component, a sixth amplifier component, in which the first main electrode is connected to the first potential of the operating voltage source, the second main electrode is operationally connected to the second potential of the operating voltage source via a resistor or a current source and the control electrode is connected to the second main electrode or the control electrode of the second amplifier component, the control electrodes of the third and the fourth amplifier component being cross-connected to the second main electrode of the fifth and the sixth amplifier component, respectively.

The multivibrator according to the invention is provided with the third and the fourth amplifier component, acting as active pull-down components. The pull-down amplifier components are cross-connected in such a way that they are alternately in conducting and non-conducting state due to a forced control by the state of the first and the second amplifier component. When the second amplifier component is in non-conducting state and the first amplifier component is in conducting state, a third pull-down amplifier component connected between the second main electrode of the first amplifier component and the second operating voltage potential is in non-conducting state. A fourth pull-down amplifier component connected between the second main electrode of the second amplifier component and the second operating voltage potential is in conducting state pulling down the second main electrode to the second operating voltage potential. Then the circuit has only one circuit path via the first amplifier component, the capacitive component and the fourth amplifier component. Correspondingly, when the first amplifier component is in non-conducting state and the second amplifier component is in conducting state, the fourth pull-down component is in non-conducting state and the third pull-down amplifier component in conducting state. Then the circuit has only one circuit path via the second amplifier component, the capacitive component and the third pull-down amplifier component. In this "double-cross-connected" multivibrator circuit, an output signal amplitude twice as high as in the prior art multivibrator circuits is achieved by pull-down technique at the same operating voltage.

The pulse shape of the multivibrator circuit according to the invention can be improved and its speed can be increased by applying control signals from the second main electrode or the control electrode of the first and the second amplifier component to the control electrodes of the fourth and the third pull-down amplifier component, respectively, via buffer amplifier components.

BRIEF DESCRIPTION OF THE DRAWINGS

In the following, the invention is described with reference to the attached drawings, in which.

PREFERRED EMBODIMENTS OF THE INVENTION

The present invention is applicable to lowering operating voltage and increasing speed in so-called emitter-coupled multivibrator circuits. Although the multivibrator circuits according to the prior art, shown in FIGS. 1 and 2, as well as the multivibrator circuits according to the invention, shown in FIGS. 3 to 7, use bipolar transistors as amplifier means, the circuit solutions according to the invention may use any type of non-linear amplifier components, in principle, such as MOS, CMOS, SOI, HEMT and HBT transistors, microwave tubes and vacuum tubes. The names of the electrodes may vary in these components. The main electrodes of a bipolar transistor are a collector and an emitter and the control electrode is a base. In FETs, the corresponding electrodes are a drain, a source and a gate. In vacuum tubes, these electrodes are usually called an anode, a cathode and a gate. Thus the term emitter-coupled multivibrator shall also be understood in this connection as a more general concept, covering e.g. the terms cathode-coupled or source-coupled multivibrator.

Figure 3:
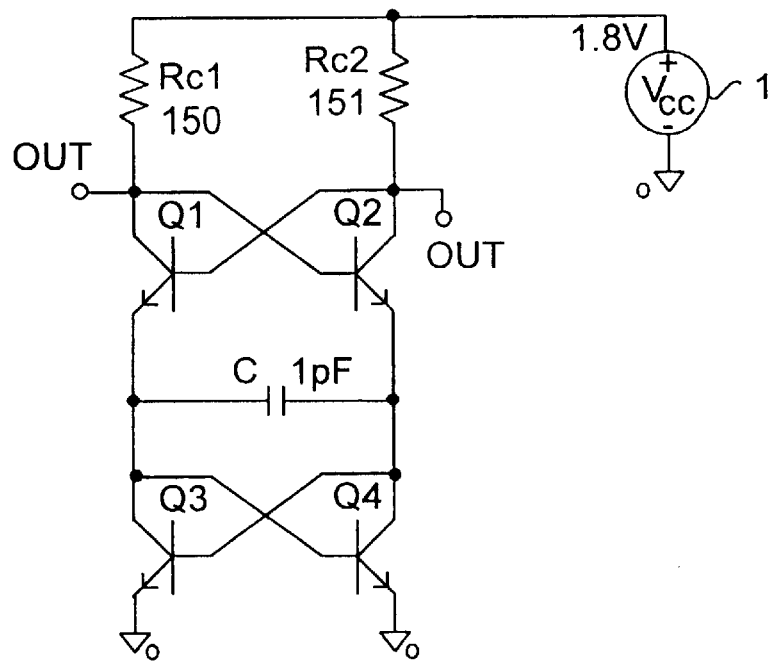
FIGS. 3, 4, 5, 6 and 7 are circuit diagrams, showing different double-cross-connected multivibrator circuits according to the invention.

FIG. 3 shows an emitter-coupled multivibrator circuit according to a first embodiment of the invention. The circuit comprises four NPN bipolar transistors Q1, Q2, Q3 and Q4. A collector electrode of the transistor Q1 is connected via a resistor Rc1 to a positive operating voltage Vcc of an operating voltage source 1 and an emitter is connected to a collector of the transistor Q3. An emitter of the transistor Q3 is connected to a lower operating voltage potential, e.g. 0V, of the voltage source 1. A collector of the transistor Q2 is connected via a resistor Rc2 to the operating voltage Vcc and an emitter to a collector of the transistor Q4. An emitter of the transistor Q4 is connected to the operating voltage 0V. A capacitor C is connected between the emitters of the transistors Q1 and Q2. A positive feedback is provided between the transistors Q1 and Q2 by cross-connecting a base of Q1 to the collector of Q2 and a base of Q2 to the collector of Q1. Correspondingly, a positive feedback is provided between the transistors Q3 and Q4 by cross-connecting a base of Q3 to the collector of Q4 (emitter of Q2) and a base of Q4 to the collector of Q3 (emitter of Q1). The positive feedbacks and series resonance circuits Rc1-C and Rc2-C constituted by the resistors Rc1, Rc2 and the capacitor C provide that a multivibrator output (e.g. emitter of Q2) oscillates between two states, when the oscillation once has been triggered. The resonance frequency of the circuit is set by the values of the components Rc1, Rc2 and C. The resonance frequency can be controlled e.g. by controlling the values of these components in a manner known per se.

Figure 1:
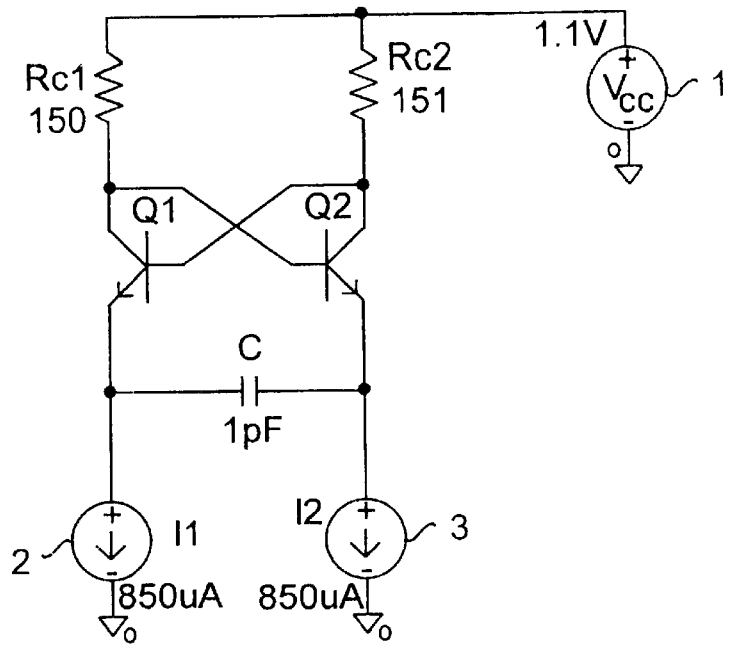
FIGS. 1 and 2 are circuit diagrams, showing two emitter-coupled multivibrator circuits according to the prior art.
Figure 2:
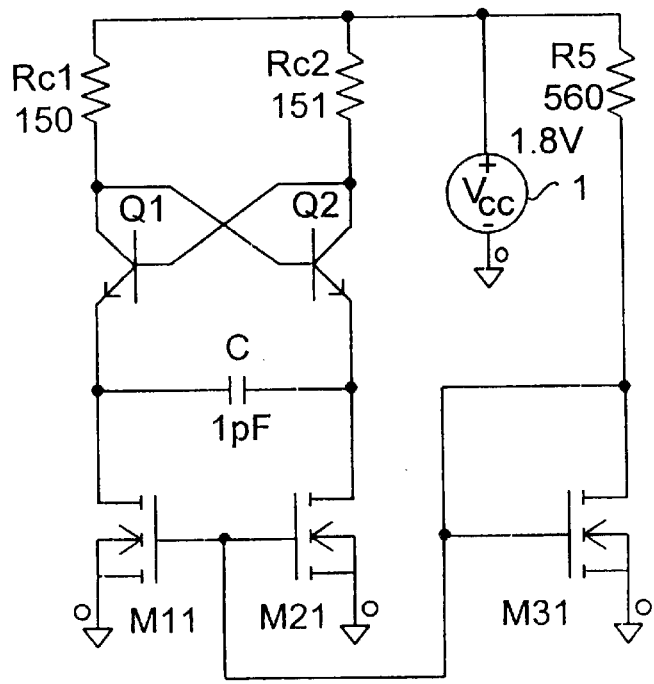

In the multivibrator circuit of the invention, the pull-down transistors Q3 and Q4 replace the current sources of the conventional multivibrator circuit shown in the FIGS. 1 and 2. Due to the cross-connection of the transistors Q3 and Q4, they are alternately on and off, under forced control by the states of the transistors Q1 and Q2. Let us assume for instance that the transistor Q1 is on and the transistor Q2 is off. Then the emitter of the transistor Q1 supplies the base of the transistor Q4 with base current, due to which the transistor Q4 is conducting. In the conduction state, the transistor 04 pulls down the emitter voltage of Q2 to the potential 0V almost without voltage loss. In consequence of this, the transistor Q3 having the base connected to the emitter of Q2 is off. Then there is no current through Q3. The multivibrator circuit has now only one current path, i.e. Rc1-Q1-C-Q4. The transistor Q3, when non-conducting, separates one terminal of the capacitor C entirely from the potential 0V. The transistor Q4 being on connects the other terminal of the capacitor C to the potential 0V almost without voltage loss. In the other oscillating state, correspondingly, Q1 is off, Q2 is on, Q3 is on and Q4 is off. Then the multivibrator circuit has only one current path, i.e. Rc2-Q2-C-Q3. Q4 not being on separates one terminal of the capacitor C entirely from the potential 0V. The transistor Q3 being on pulls down the other terminal of the capacitor C to the potential 0V almost without voltage loss. It is thus possible to bring the greatest possible part of the operating voltage across the capacitor. Due to the fact that voltage losses caused by current sources in conventional multivibrator circuits can be avoided thanks to the cross-connected pull-down transistors Q3 and Q4, the double-cross-connected multivibrator circuit according to the invention implemented by pull-down technique produces an output signal amplitude twice as strong as the conventional circuits of FIGS. 1 and 2 at the same operating voltage.

The pulse shapes of the circuit of FIG. 3 are, however, relatively poor. This is due to the fact that even if the bipolar transistors Q3 and Q4 are quick, the main problem with them consists in the high base currents required. These disturb the recharge process of the reference capacitor C in an unacceptable way and increase the phase noise significantly. Also the speed of the multivibrator circuit is considerably lower than in the conventional circuits of the FIGS. 1 and 2.

Figure 4:
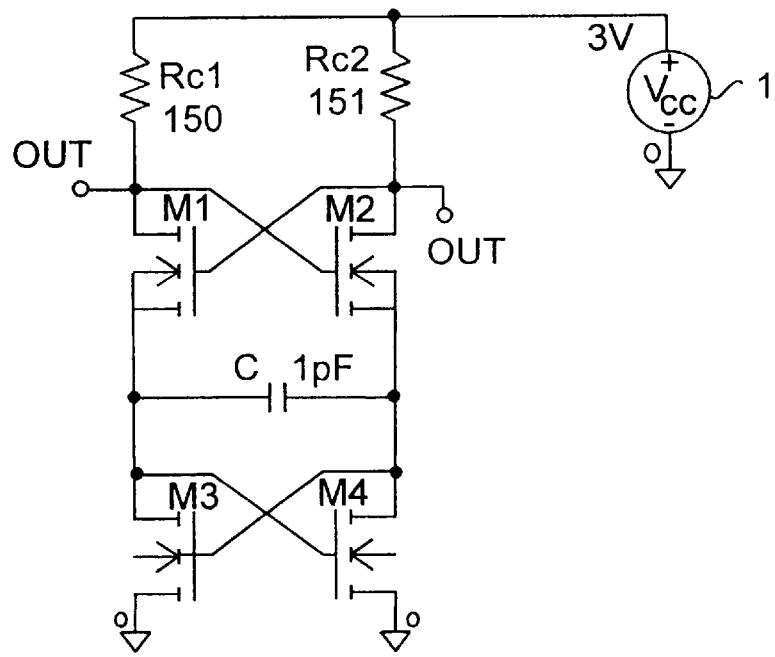

These problems relating to pulse shape, disturbances and speed can be eliminated by replacing the bipolar transistors Q1 to Q4 of FIG. 3 by MOS transistors, as shown in FIG. 4. The use of MOS transistors decreases the currents required for the control of the pull-down transistors. The basic connection and operation of the circuit of FIG. 4 are essentially similar to those of the circuit of FIG. 3. The circuit of FIG. 4 comprises four MOS transistors M1, M2, M3 and M4. A source electrode of the transistor M1 is connected via a resistor Rc1 to a positive operating voltage Vcc of an operating voltage source 1 and a drain is connected to a source electrode of the transistor M3. A drain of the transistor M3 is connected to a lower operating voltage potential, e.g. 0V, of the voltage source 1. A source electrode of the transistor M2 is connected via a resistor Rc2 to the operating voltage Vcc and a drain to a source electrode of the transistor Q4. A drain of the transistor M4 is connected to the operating voltage 0V. A capacitor C is connected between the emitters of the transistors M1 and M2. A positive feedback is provided between the transistors M1 and M2 as well as between the transistors M3 and M4 on the same principle as in FIG. 3. The operation of the circuit of FIG. 4 is also otherwise essentially similar to the operation of the circuit of FIG. 3. An essential difference is, however, that a higher supply voltage, e.g. Vcc=3 V, has to be used on account of the properties of the MOS transistors (high volume resistances and low amplification, primarily). However, the pulse shape achieved is still poor and the frequency relatively low.

Figure 5:
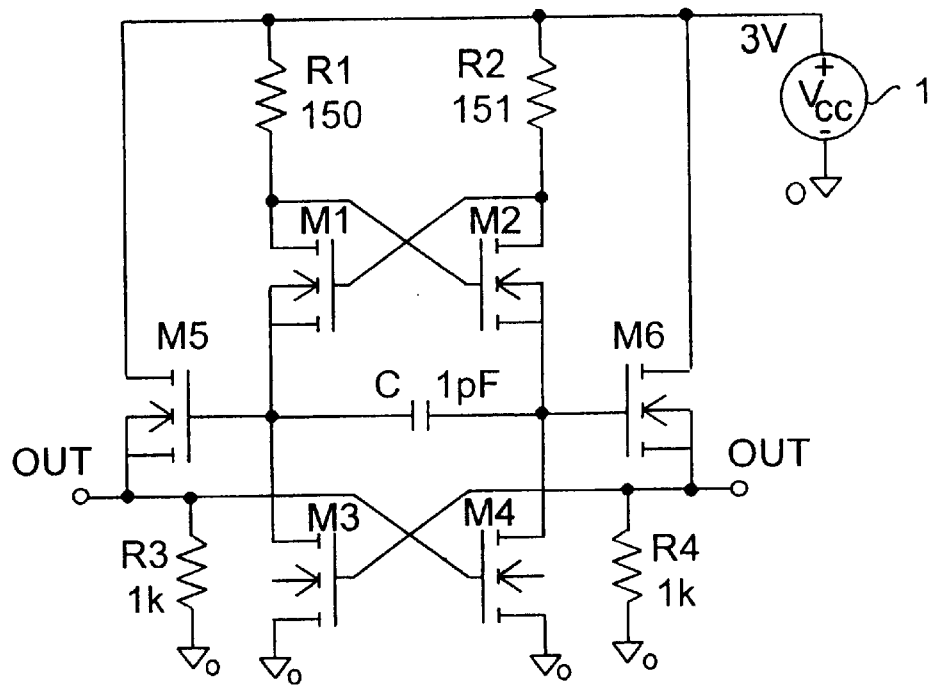

An improved multivibrator circuit based exclusively on MOS transistors is shown in FIG. 5. The circuit of FIG. 5 is provided with MOS transistors M5 and M6 acting as buffer transistors, via which signals from drain electrodes of transistors M1 and M2 are applied to control a pull-down of pull-down transistors M3 and M4, respectively. To be more exact, a source of the first buffer transistor M5 is connected to an operating voltage Vcc and a drain electrode is connected to a gate of the pull-down transistor M4 and via a resistor R3 to an operating voltage potential 0V. A gate of M5 is connected to the drain electrode of M1. Correspondingly, a source of the other buffer transistor M6 is connected to the operating voltage Vcc and a drain electrode is connected to a gate of the pull-down transistor M3 and via a resistor R4 to the operating voltage potential 0V. The buffer transistors M5 and M6 are capable of generating a higher control current for the gate electrodes of the transistors M3 and M4, which current discharges parasitic capacitances of the gate electrodes faster. This accelerates the switching of the transistors M3 and M4. Additionally, the control of the transistors M3 and M4 is separated from the proper resonance circuit, which decreases disturbances in the operation of the resonance circuit. A better pulse shape and a speed increase of about 15% are achieved by the multivibrator circuit of FIG. 5 compared to the multivibrator circuit of FIG. 4, but no lower operating voltage.

Figure 6:
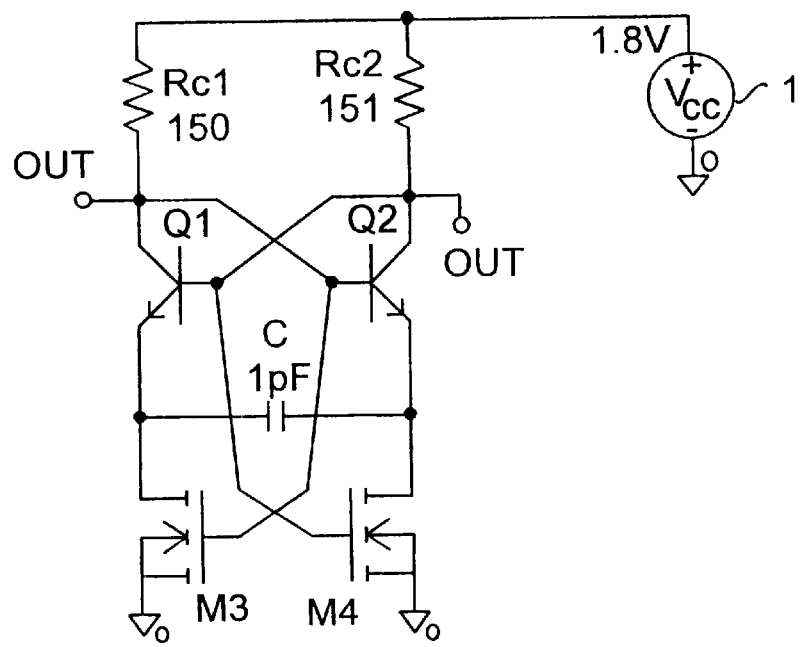

FIG. 6 shows a multivibrator according to the invention, implemented by BiCMOS technique. The circuit of FIG. 6 resembles the circuit of FIG. 3, but the bipolar transistors Q3 and Q4 are replaced by MOS transistors M3 and M4 with their gate electrodes cross-connected to base electrodes of the transistors Q1 and Q2. This is possible, because the load caused by the gate electrodes of the MOS transistors M3 and M4 is insignificant compared to base currents of the transistors Q1 and Q2 and does therefore not disturb the operation of the transistors Q1 and Q2. To be precise, a collector electrode of the transistor Q1 in the circuit of FIG. 6 is connected via a resistor Rc1 to a positive operating voltage Vcc of an operating voltage source 1 and an emitter is connected to a source electrode of the transistor M3. A drain electrode of the transistor M3 is connected to the operating voltage potential 0V. A collector of the transistor Q2 is connected via a resistor Rc2 to the operating voltage Vcc and an emitter to a source electrode of the transistor M4. An emitter of the transistor M4 is connected to the operating voltage 0V. A capacitor C is connected between the emitters of the transistors Q1 and Q2. A positive feedback is provided between the transistors Q1 and Q2 in the same way as in FIG. 3. The gate electrode of the transistor M3 is connected to the base electrode of the transistor Q2 and the gate electrode of the transistor M4 is connected to the base electrode of the transistor Q1. In consequence of this cross-connection, Q2 and M3 are off when Q1 and M4 are conducting, and Q1 and M4 are off when Q2 and M3 are conducting. Because the transistors Q1 and Q2 in the circuit of FIG. 6 are bipolar transistors, the problem with the circuit of FIG. 4, i.e. high operating voltage, is avoided. Thanks to the active pull-down operation implemented by the MOS transistors M3 and M4, the speed of the circuit is, however, the same as that of the conventional circuits (FIGS. 1 and 2), but the amplitude is twice as high. It is therefore possible to use the circuit of FIG. 6 at a much lower operating voltage, e.g. 1.1V, than that of a conventional multivibrator circuit, where the same performance requires an operating voltage of 1.8V.

Figure 7:
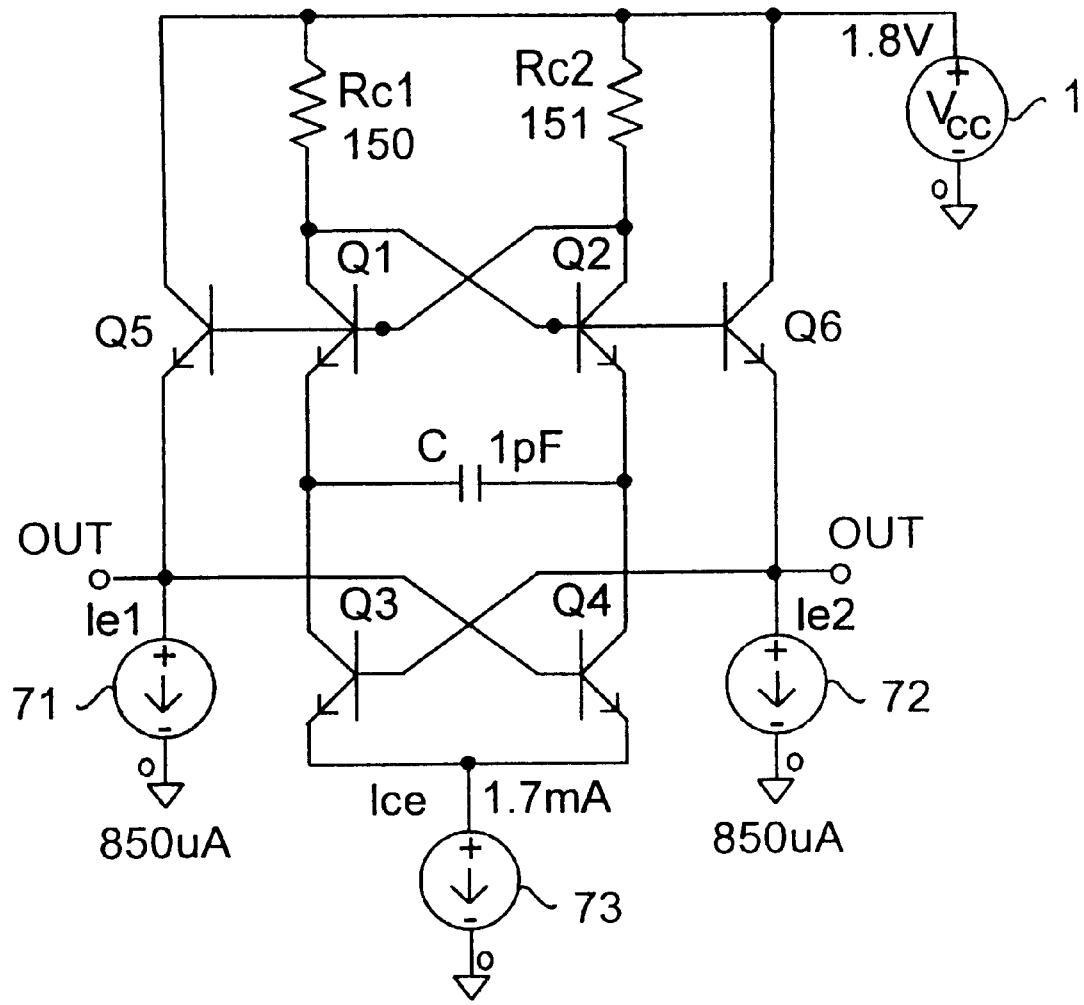

A further multivibrator circuit according to the invention is provided by applying the buffer transistor solution used in the circuit of FIG. 5 to the circuit of FIG. 3. Such a multivibrator circuit is shown in FIG. 7. The circuit comprises six NPN bipolar transistors Q1, Q2, Q3, Q4, Q5 and Q6. A collector electrode of the transistor Q1 is connected via a resistor Rc1 to an operating voltage Vcc and an emitter is connected to a collector of the transistor Q3. A collector of the transistor Q2 is connected via a resistor Rc2 to the operating voltage Vcc and an emitter to a collector of the transistor Q4. Emitters of the transistors Q3 and Q4 are connected to an operating voltage 0V. A capacitor C is connected between the transistors Q1 and Q2. A positive feedback is provided between the transistors Q1 and Q2 in the same way as in the circuit of FIG. 3. Additionally, the circuit of FIG. 7 is provided with buffer transistors Q5 and Q6, through which signals are applied from bases of the transistors Q1 and Q2 to base electrodes of the transistors Q3 and Q4. Thanks to the buffer transistors Q5 and Q6, higher base currents can be generated for the transistors Q3 and Q4, which accelerates the discharge of parasitic capacitances of the base electrodes and thus the switching speed of the transistors Q3, Q4. To be precise, a collector electrode of the buffer transistor Q5 is connected to the operating voltage Vcc and an emitter is connected to a base electrode of the pull-down transistor Q4 and via a current source 71 to the operating voltage potential 0V. A base electrode of Q5 is connected to a base electrode of Q1. A collector of the buffer transistor Q6 is connected to the operating voltage Vcc and an emitter is connected to the base electrode of the pull-down transistor Q3 and via a current source 72 to the operating voltage potential 0V. A base electrode of Q6 is connected to a base electrode of Q2. The emitters of the transistors Q3 and Q4 are interconnected and connected via a current source 73 to the operating voltage potential 0V. By means of the current sources 71, 72 and 73, the operating point of the circuit can be set and the resonance frequency can be determined. The circuit of FIG. 7 achieves an about 40% higher speed than any other of the circuits described above. The pulse shape is also one of the best among the alternatives described.

The circuit of FIG. 7 has been analyzed by using 0.8 $\mu$m BiCMOS technology, in which bipolar NPN transistors have a transient frequency $F_T$= 14 GHz. The current flowing through the transistors is selected in such a way that it provides this transient frequency $F_{TMAX}$, the current being about 850 $\mu$A on this technology while a collector-emitter voltage $V_{ce}$ is about 0.8 V. In FIG. 7, the current source 71 determining the current flowing through the transistor Q5 is therefore 850 $\mu$A. Correspondingly, the current source 72 determining the current flowing through the transistor Q6 is 850 $\mu$A. The current source 73 determining the currents flowing through the transistors Q1, Q3 and the transistors Q2, Q4, respectively, is 1.7 nA, when the oscillation is desired to take place at the maximum frequency, in this case being about 1.4 GHz. Further, collector resistors having the value of 150 ohm are used for achieving an amplitude of at least 400 mV for the differential signals of the collectors. The power consumption is about 5.0 mW from the operating voltage 2.2 V. The reference capacitor C is provided with the value 1.0 pF and is for this technology a reasonably small capacitor of RF type.

The drawings and the related description are only intended to illustrate the invention. The details of the invention may vary within the scope and spirit of the attached claims.

We claim:

1. Multivibrator circuit, comprising:
   an operating voltage source,
   a first bipolar transistor comprising a first and a second main electrode, and a base electrode,
   a second bipolar transistor comprising a first and a second main electrode, and a base electrode, the first main electrode of the second bipolar transistor being connected to control the base electrode of the first bipolar transistor, and respectively, the first main electrode of the first bipolar transistor being connected to control the base electrode of the second bipolar transistor,
   a capacitive component connected between the second main electrode of the first bipolar transistor and the second main electrode of the second bipolar transistor,
   a first and a second resistor, via which the first main electrode of the first bipolar transistor and the first main electrode of the second bipolar transistor, respectively, are connected to a first potential of the operating voltage source,
   a first pull-down MOS transistor connected in series between the second main electrode of the first bipolar transistor and a second potential of the operating voltage source, and having a gate electrode,
   a second pull-down MOS transistor connected in series between the second main electrode of the second bipolar transistor and the second potential of the operating voltage source, and having a gate electrode,
   the gate electrodes of the first and second pull-down MOS transistors being cross-connected to the base electrode of the second and the first bipolar transistors, respectively.

2. Multivibrator circuit, comprising
   an operating voltage source,
   a first amplifier component comprising a first and a second main electrode and a control electrode,
   a second amplifier component comprising a first and a second main electrode and a control electrode, the first main electrode of the second amplifier component being connected to control the control electrode of the first amplifier component, and, respectively, the first main electrode of the first amplifier component being connected to control the control electrode of the second amplifier component,
   a capacitive component connected between the second main electrode of the first amplifier component and the second main electrode of the second amplifier component,
   a first and a second resistor, via which the first main electrode of the first amplifier component and the first main electrode of the second amplifier component, respectively, are connected to a first potential of the operating voltage source,
   a third amplifier component connected in series between the second main electrode of the first amplifier component and a second potential of the operating voltage source,
   a fourth amplifier component connected in series between the second main electrode of the second amplifier component and the second potential of the operating voltage source,
   a fifth amplifier component, in which a first main electrode is connected to the first potential of the operating voltage source, a second main electrode is operationally connected to the second potential of the operating voltage source via a resistor or a current source, and a control electrode is connected to the second main electrode or the control electrode of the first amplifier component,
   a sixth amplifier component, in which a first main electrode is connected to the first potential of the operating voltage source, a second main electrode is operationally connected to the second potential of the operating voltage source via a resistor or a current source and a control electrode is connected to the second main electrode or the control electrode of the second amplifier component,
   the control electrodes of the third and the fourth amplifier components being cross-connected to the second main electrode of the fifth and the sixth amplifier components, respectively.

3. Multivibrator circuit according to claim 2, wherein the first, the second, the third, the fourth, the fifth and the sixth amplifier components are bipolar transistors and that the control electrode of the fifth and the sixth amplifier components is a base connected to the control electrode of the first and the second amplifier components, respectively, the control electrode of the first and second amplifier components being a base.

4. Multivibrator circuit according to claim 2, wherein the first, the second, the third, the fourth, the fifth and the sixth amplifier components are MOS transistors and that the control electrode of the fifth and the sixth amplifier components is a gate connected to the second main electrode of the first and the second amplifier components, respectively.

5. Multivibrator according to claim 3, wherein the second main electrodes of the third and the fourth amplifier components are emitters, which are interconnected and connected via a first current source to the second potential of the voltage source.

6. Multivibrator circuit according to claim 5, wherein the second main electrode of the fifth and sixth amplifier components, this electrode being an emitter, is connected via a second and a third current source, respectively, to the second potential of the voltage source.

* * * * *

UNITED STATES PATENT AND TRADEMARK OFFICE
CERTIFICATE OF CORRECTION

PATENT NO. : 5,990,718
DATED : November 23, 1999
INVENTOR(S) : Nikolay Tchamov, et al.

It is certified that error appears in the above-indentified patent and that said Letters Patent is hereby corrected as shown below:

On the Title Page, Section [30]: "96198" should read --961983--

Column 2, line 7: "th an" should read --than--

Column 4, line 41: "04" should read --Q4--

Signed and Sealed this

Third Day of April, 2001

Attest:

NICHOLAS P. GODICI

Attesting Officer

Acting Director of the United States Patent and Trademark Office